(12) United States Patent
Yamada

(10) Patent No.: US 6,841,853 B2
(45) Date of Patent: Jan. 11, 2005

(54) SEMICONDUCTOR DEVICE HAVING GROOVES TO RELIEVE STRESS BETWEEN EXTERNAL ELECTRODES AND CONDUCTIVE PATTERNS

(75) Inventor: Shigeru Yamada, Tokyo (JP)

(73) Assignee: Oki Electronic Industry Co., Ltd., Tokyo (JP)

(*) Notice: Subject to any disclaimer, the term of this patent is extended or adjusted under 35 U.S.C. 154(b) by 0 days.

(21) Appl. No.: 10/364,373

(22) Filed: Feb. 12, 2003

(65) Prior Publication Data

US 2003/0222353 A1 Dec. 4, 2003

(30) Foreign Application Priority Data

May 31, 2002 (JP) ........................................ 2002-159341

(51) Int. Cl.[7] .......................... H01L 23/12; H01L 23/48; H01L 23/52
(52) U.S. Cl. ....................... 257/666; 257/698; 257/696; 257/691; 257/673; 257/690; 257/784; 257/751; 257/734; 257/737; 257/738; 257/774; 257/773
(58) Field of Search ................................. 257/666, 673, 257/690, 696, 698, 734, 737, 738, 751, 773, 774, 784, 786, 691

(56) References Cited

U.S. PATENT DOCUMENTS

| | | | | |
|---|---|---|---|---|
| 6,037,786 A | * | 3/2000 | Palagonia .................... | 324/754 |
| 6,085,968 A | * | 7/2000 | Swindlehurst et al. ...... | 228/254 |
| 6,400,021 B1 | * | 6/2002 | Cho ............................ | 257/738 |
| 2002/0011677 A1 | * | 1/2002 | Yokoi et al. ................ | 257/782 |
| 2002/0125043 A1 | * | 9/2002 | Yoshida ....................... | 174/261 |
| 2003/0089969 A1 | * | 5/2003 | Hashimoto ................... | 257/669 |
| 2003/0092219 A1 | * | 5/2003 | Ohuchi et al. .............. | 438/110 |
| 2003/0218246 A1 | * | 11/2003 | Abe et al. .................... | 257/734 |

FOREIGN PATENT DOCUMENTS

| | | |
|---|---|---|
| JP | 2000-340696 | 12/2000 |
| JP | 2001-144217 | 5/2001 |
| JP | 2001-196403 | 7/2001 |
| JP | 2001-332653 | 11/2001 |
| JP | 2002-93948 | 3/2002 |
| JP | 2002-280484 | 9/2002 |
| JP | 2002-280487 | 9/2002 |
| WO | WO 00/77843 | 12/2000 |

* cited by examiner

*Primary Examiner*—Alexander Oscar Williams
(74) *Attorney, Agent, or Firm*—Volentine Francos & Whitt, PLLC

(57) ABSTRACT

A semiconductor device including a semiconductor chip having an electric circuit on a surface thereof, and an electrode pad formed on the surface of the semiconductor chip and which is electrically connected to the electric circuit. A conductive pattern is electrically connected to the pad, and a sealing resin covers the electric circuit and the conductive pattern. A part of the conductive pattern is exposed from the sealing resin, and a plurality of grooves are formed on the part of the conductive pattern. The plurality of grooves are disposed apart from each other and along a direction of stress of the expanding semiconductor chip. An external electrode is electrically connected to the conductive pattern. Stress of the external electrodes is thus relieved and as a result, reliability of the semiconductor device can be improved, because deterioration of the connecting quality can be prevented.

29 Claims, 5 Drawing Sheets

SEMICONDUCTOR DEVICE HAVING GROOVES TO RELIEVE STRESS BETWEEN EXTERNAL ELECTRODES AND CONDUCTIVE PATTERNS

BACKGROUND OF THE INVENTION

1. Field of the Invention

The present invention relates to a semiconductor device, and in particular to a chip size package of a wafer level (WCSP), which packages a semiconductor chip in a wafer state.

This application is a counterpart of Japanese patent application, Serial Number 159341/2002, filed May 31, 2002, the subject matter of which is incorporated herein by reference.

2. Description of the Related Art

In recent years, components for electric devices need small size and high performance with the advance of electric technologies.

Following such trends, chip size package (CSP) technologies have been introduced in the art of semiconductor packaging. These technologies can minimized the semiconductor package almost the size of the large-scale integrated circuit (LSI) chips.

To achieve the advance of productivity and the decrease cost, many companies and institutes are developing the practical CSP technologies, which are packaging a semiconductor chip in a wafer state (called a wafer level CSP as follows).

The technology of the wafer level CSP includes a step of forming conductive patterns and external electrodes on each semiconductor chip and a step of sealing each semiconductor chip by an insulated resin, which are performing in a wafer state without being separated into individual chips.

In addition, the conventional semiconductor device of wafer level CSP has a plurality of external electrodes arranging like an area array. Therefore, the conventional semiconductor device of wafer level CSP can be fit for the semiconductor chip needed many external electrodes to execute many commands.

However, the conventional semiconductor device of wafer level CSP, which is mounted on the printed board (the mother board), has a gap of the thermal expansion coefficient between the mother board and the semiconductor package. Especially, the gap is occurred between the mother board and the silicon chip including the wafer level CSP. As a result, during a thermal process, for example in the step of mounting the device on the mother board and the step of using the device, a large stress (a thermal stress) is occurred to the semiconductor device.

FIGS. 1(a) and 1(b) are sectional views showing a distribution of stress which is occurred by falling in temperature of the conventional semiconductor device of wafer level CSP, which has area type conductive pads, mounted onto the mother board. These figures are pattern diagrams showing simulated results. This simulation is performed under the condition that the temperature of the device changes from −40° C. to 125° C.

FIG. 1(a) is a plane view of the conventional semiconductor device showing the side of the device connected to the external electrodes. FIG. 1(b) is a cross sectional view of the conventional semiconductor device, viewed from 1–1' line of FIG. 1(a). FIG. 1(b) shows an enlarged point of the conventional semiconductor device. In FIG. 1(b), the direction of the left side is nearing the center 508 of the package 500 and the direction of the right side is nearing the periphery 509 of the package 500.

As shown in FIGS. 1(a) and (b), during when the temperature of the device is falling, thermal stress occurs to the semiconductor device 500 due to contraction with the large difference in thermal expansion coefficients between the silicon chip and the mother board. The thermal stress occurring to the device 500 spreads from the right side to the left side in FIG.1(b), namely from the periphery 509 of the device 500 to the center 508 of the device 500.

The semiconductor package has a semiconductor substrate 502, conductive patterns 503 which are electrically connecting to a semiconductor element formed on the substrate 502, a sealing resin 504 which covers the substrate 502 and conductive patterns 503 and external electrodes 505. The semiconductor device comprises the mother board 501 and the package, wherein the package is mounted on the board via the external electrodes 505.

During when the temperature of the device is falling, the mounted semiconductor device has a large difference in thermal expansion coefficients between the silicon chip and the mother board (the thermal expansion coefficient of the silicon substrate is smaller than the thermal expansion coefficient of the mother board). Therefore, the thermal stress 506b, which is more than the thermal stress 506a of the semiconductor package (the semiconductor substrate), is applied to the mother board 501. There is a large gap of the thermal stress in the semiconductor device.

By this large gap, the great thermal stress is exerted on the external electrodes 505, e.g., solder balls, connecting to the mother board 501 and the semiconductor package. Especially, as shown in FIG. 1(b), thermal stress is concentrated to a point 507 of the external electrode 505 that is the end bonded to the semiconductor package and apart from the center of the device. The concentrated stress of the point 507 can damage the external electrode 505.

In the conventional semiconductor device, these stresses are exerted on the external electrodes and the conductive patterns, so that these stresses cause a problem, that is the damage of the external electrodes and the breaking of the conductive patterns, lead the low reliability of the semiconductor device.

JP-A-2002-280484 (Laid-open on Sep. 27, 2002) describes a chip size/scale package which has a resin post having roughness formed on the top of this resin post and covering a conductive layer. This resin post enables a stress to spread and absorb and strength of solder joint to be improved.

JP-A-2002-280487 (Laid-open on Sep. 27, 2002) also describes a chip size/scale package. This chip size/scale package has a metal post having a groove formed on the top of this metal post. This metal post enables a stress to spread and absorb and strength of solder joint to be improved.

SUMMARY OF THE INVENTION

It is therefore an object of the present invention to provide a semiconductor device to avoid the serious problem that is the low reliability of the semiconductor device caused by the damage of the external electrodes and the breaking of the conductive patterns.

In accordance with a first representative semiconductor device of the Invention, there is provided a semiconductor device which includes: a semiconductor chip having a surface, an electric circuit formed on the surface of the semiconductor chip, a electrode pad formed on the surface of the semiconductor chip, the electrode pad electrically connecting to the electric circuit, a conductive pattern electrically connecting to the pad, a sealing resin covering the electric circuit and the conductive pattern, wherein a part of the conductive pattern is exposed from the sealing resin, a plurality of grooves formed on the part of the conductive pattern, a plurality of the grooves disposed apart from each other and along by a direction of stress expanding the semiconductor chip, and an external electrode electrically connecting to the conductive pattern.

Further, in accordance with a second representative semiconductor device of the Invention, there is provided a semiconductor device which includes: a semiconductor chip having a surface, an electric circuit formed on the surface of the semiconductor chip, a electrode pad formed on the surface of the semiconductor chip, the electrode pad electrically connecting to the electric circuit, an insulated resin post provided on the surface of the semiconductor chip, the resin post disposed adjacent to the electrode pad, a conductive layer formed on a top of the resin post from the electrode pad, the conductive layer electrically connecting to the electrode pad, a sealing resin covering the electric circuit and the conductive pattern, wherein the conductive layer formed on the top of the resin post is exposed from the sealing resin, a plurality of grooves formed on the conductive pattern which is exposed from the sealing resin, a plurality of the grooves disposed apart from each other and along by a direction of stress expanding the semiconductor chip, and an external electrode electrically connecting to the conductive layer.

Moreover, in accordance with a third representative semiconductor device of the Invention, there is provided a semiconductor device which includes: a semiconductor chip having a surface, an electric circuit formed on the surface of the semiconductor chip, a electrode pad formed on the surface of the semiconductor chip, the electrode pad electrically connecting to the electric circuit, an insulating layer covering the electric circuit except the electrode pad, a conductive layer formed on the insulating layer, the conductive layer electrically connecting to the electrode pad, an conductive post provided on a surface of the conductive layer which is adjacent to the electrode pad, the conductive post electrically connecting to the conductive layer, a sealing resin covering the electric circuit and the conductive pattern, wherein a top of the conductive post is exposed from the sealing resin, a plurality of grooves formed on the top of the conductive post, the plurality of the grooves disposed apart from each other and along by a direction of stress expanding the semiconductor chip, and an external electrode formed on the top of the conductive post, the external electrode electrically connecting to the conductive post.

Thus, the invention provides the semiconductor device which can relieve the stress of the external electrodes and the stress between the external electrodes and the conductive patterns.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1A:
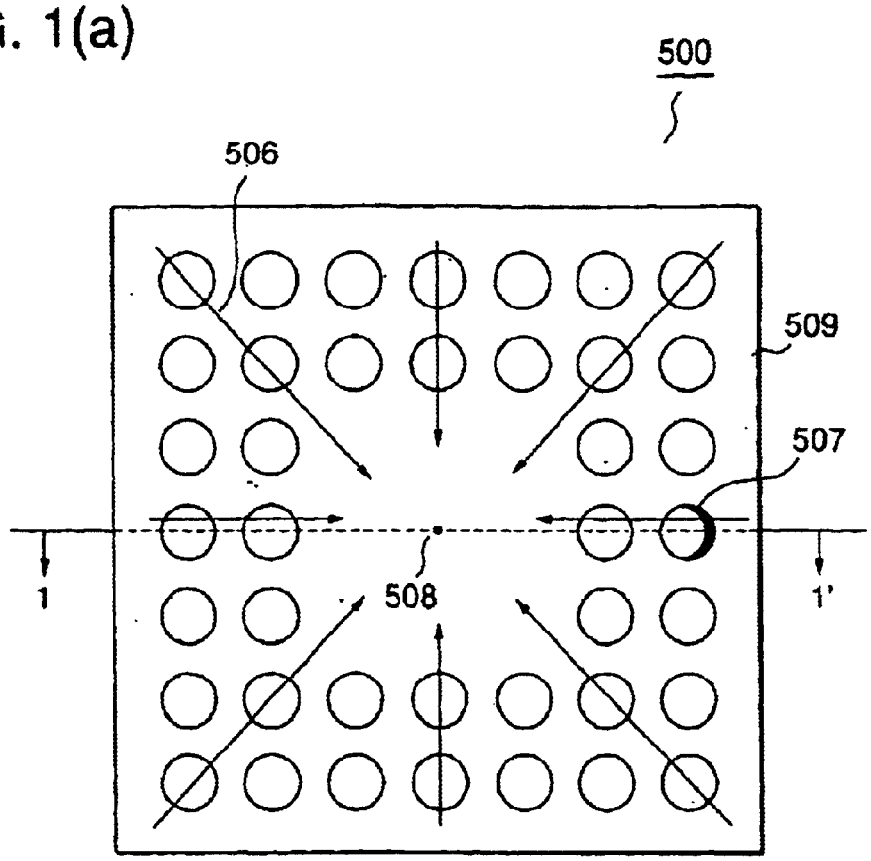
FIGS. 1(a) and 1(b) are views showing a distribution of stress that is caused by falling in temperature of the conventional semiconductor device.
Figure 1B:
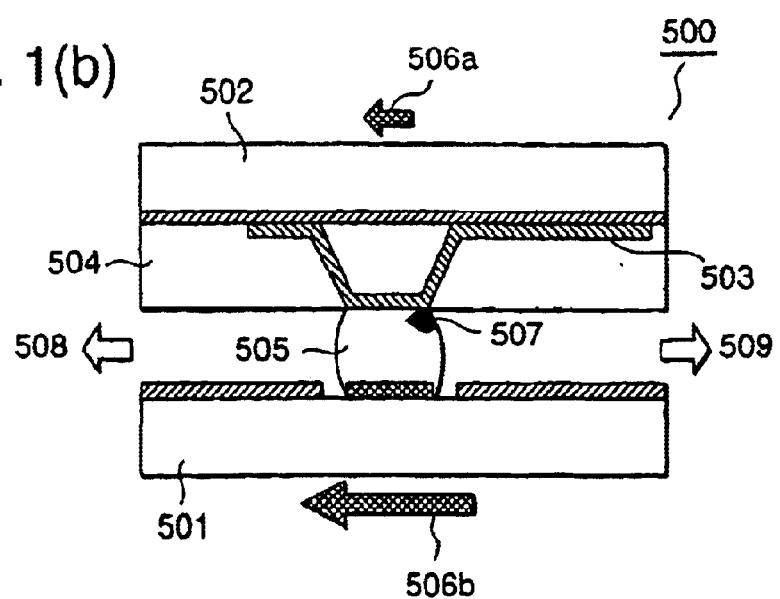

A semiconductor device according to preferred embodiment of the present invention would be explained hereinafter with reference to figures. In order to simplify explanations, like elements are given like or corresponding reference numerals through this specification and figures. Thereby, dual explanations of the same elements are avoided.

A first embodiment of the present invention will be described in further detail with reference to the accompanying drawings.

FIG. 2(a)–FIG. 2(f) are cross-sectional views showing processes in a semiconductor device according to a first embodiment of the present invention.

At first, before the step shown in FIG. 2, the conventional wafer process is performed for a semiconductor wafer 101. The surface of the wafer-processed semiconductor wafer 101 has a plurality of semiconductor elements arranged in a matrix form. These semiconductor elements are electric circuits carrying out the predetermined functions of the semiconductor device.

Figure 2A:
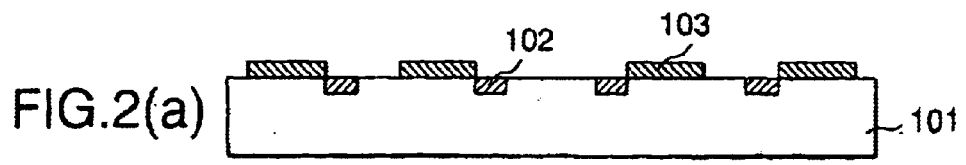
FIGS. 2(a)–2(f) are cross-sectional views showing processes in a semiconductor device according to a first embodiment of the present invention.
Figure 2B:
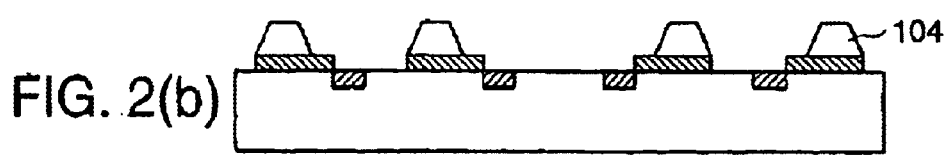

As shown in FIG. 2(a), electrode pads 102 are formed on the surface of the wafer 101 having semiconductor elements. Electrode pads 102 are electrically connected to the semiconductor elements formed on the surface of the wafer 101. After forming the electrode pads 102, resin, for example polyimide, is applied on the surface of the wafer 101 by using a spin-coat process. Excess polyimide is removed by etching, e.g. photolithography. Through these processes, a polyimide layer 103, which is an insulated layer, is formed on the wafer surface except a region corresponding the electrode pads 102 and a region along borders of each semiconductor element.

An insulated bump (an insulated post) 104, which functions as stress-absorbing, is formed on the polyimide layer 103 to mount an external electrode 109 on it. The position of the insulated bumps 104 are set at regions adjacent to the electrode pads 102.

These insulated bumps are formed by the following method.

At first, polyimide resin having photosensitivity is dropped on the wafer 101 and applied throughout the surface of the wafer 101 with a spin-coator. After that, the applied polyimide is harden by curing, and thus the polyimide layer having a predetermined thickness is formed. After forming the polyimide layer, a photo mask is provided on a region of the polyimide layer where the insulated bumps 104. Then, the photosensitive polyimide exposed from the photo mask is exposed to light. By this exposure, a region of the polyimide layer not masked by the photo mask is removed. Through these processes, a columnar stress absorbing layer, that is an insulated post comprising insulated heart-resistant resin, e.g. polyimide. Moreover, poly-benzo-oxazole and the like can be used as the insulated heat-resistant resin according to this embodiment in stead of polyimide.

In the manufacturing of this embodiment, the columnar stress-absorbing layer comprising polyimide resin is cured after the stress-absorbing layer is formed on the wafer 101. As a result, the top of the columnar stress-absorbing layer is shrunk, and the insulated bumps 104 are shaped like mesa, which is a flat tableland with steep edges. The shrunken insulated bump 104 has a large contacting area between the insulated bump and the conductive pattern 106. Moreover, a clinging efficiency between the insulated bump and the conductive pattern can be improved by an anchored effect.

If the height of the mesa-type bump 104 needs about 0.03 mm with using such a manufacturing method, it is to be desired that the thickness of the polyimide layer formed on the wafer 101 is about 0.06 mm taking thought of shrinkage in the curing process.

Figure 2C:
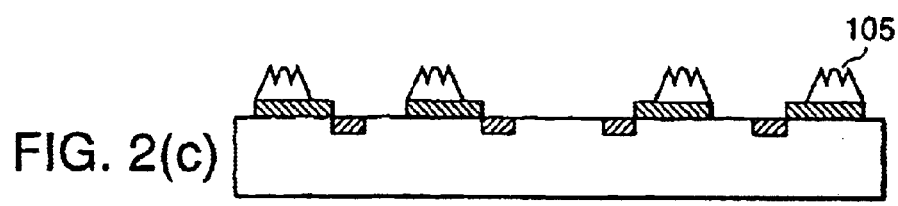

After the insulated bump 104 is provided on the polyimide layer adjacent to the electrode pads 102, as shown in FIG. 2(c), a plurality of grooves 105 are formed on the top surface of the insulated bump 104. These grooves 105 are disposed apart from each other and along the direction of expanding of the semiconductor package 100 by thermal stress. The expanding direction extends from the center of the semiconductor device to the periphery of the device. These grooves 105 formed on the top of the insulated bump 104 are provided by the conventional step, for example, etching with photolithography.

Figure 2D:
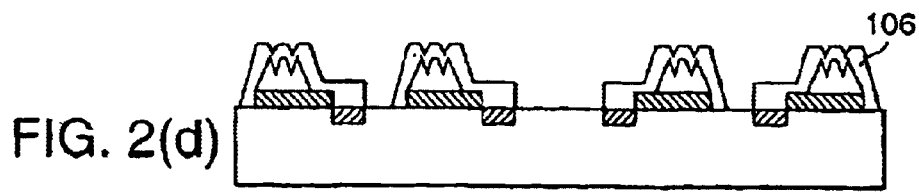

Next, as shown in FIG. 2(d), a barrier metal, for example comprising TiW is formed on the surface of the wafer 101 including the surface of the insulated bumps providing a plurality of grooves 105 on the top. The barrier metal is formed by ion-spattering. Then, Cu layer is formed on the barrier metal layer by electroplating, and the conductive pattern 106, comprising a barrier metal and a Cu layer, which extends from the electrode pad 102 to the top of the insulated bump 104 is provided. The conductive pattern is usually referred to as re-distribution trace or re-distribution pattern.

One end of each conductive pattern 106 is electrically connected to the electrode pad 102 provided on the wafer 101, and the other end of each conductive pattern 106 reaches to the top of the insulated bump 104 and covers the surface of the insulated bump 104. The conductive pattern 106 of the top of the insulated bump 104 also has a plurality of grooves corresponding to the grooves provided on the top of the insulated bump 104.

Figure 2E:
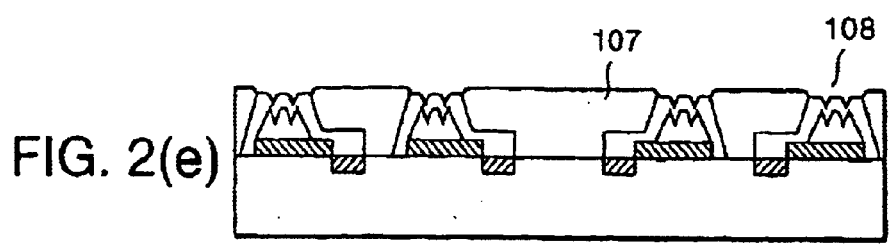

After providing the conductive patterns 106 on the predetermined position of the wafer 101, resin to cover the conductive patterns 106 and the semiconductor elements formed on the wafer 101 is applied to the wafer 101. After that, as shown in FIG. 2(e), the resin formed on the insulated bumps is removed, and sealing resin 107 having openings 108 is provided on the wafer 101, wherein each opening 108 exposes the conductive pattern 106 having the grooves 105 from sealing resin 107.

The resin to cover the conductive patterns 106 and the semiconductor elements may be applied in a spin-coating method, a printing method and so on.

In addition, the resin formed on the insulated bumps 104 can be removed by grinding the surface of the sealing resin with a grinding apparatus.

Following FIG. 3 and FIG. 4 explain grooves 105 provided on the interface between the conductive pattern 106 and the external electrode 109 in the first embodiment.

Figure 3A:
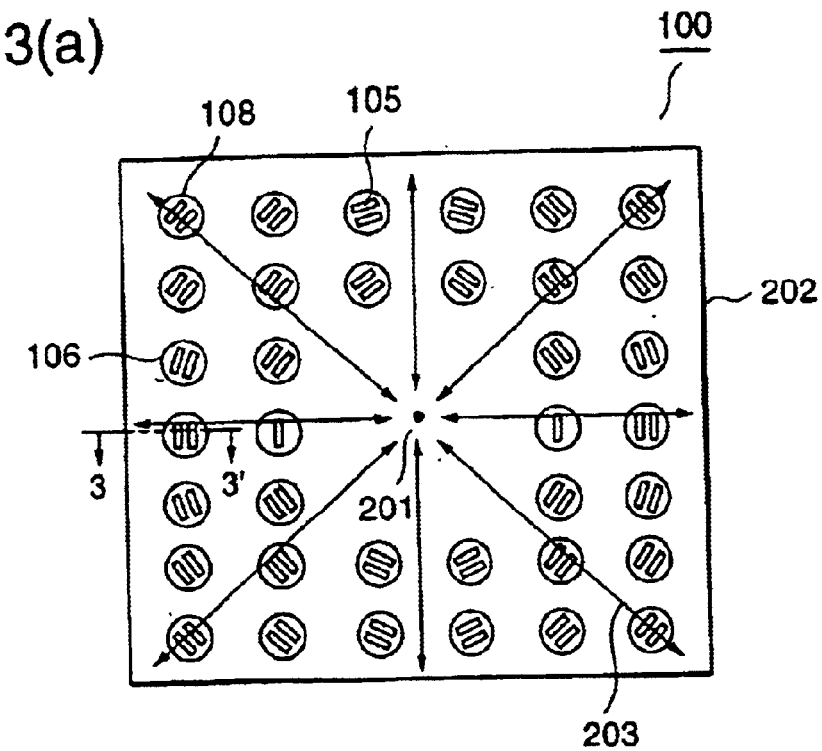
FIGS. 3(a) and 3(b) are views of a semiconductor device according to a first embodiment of the present invention.
Figure 3B:
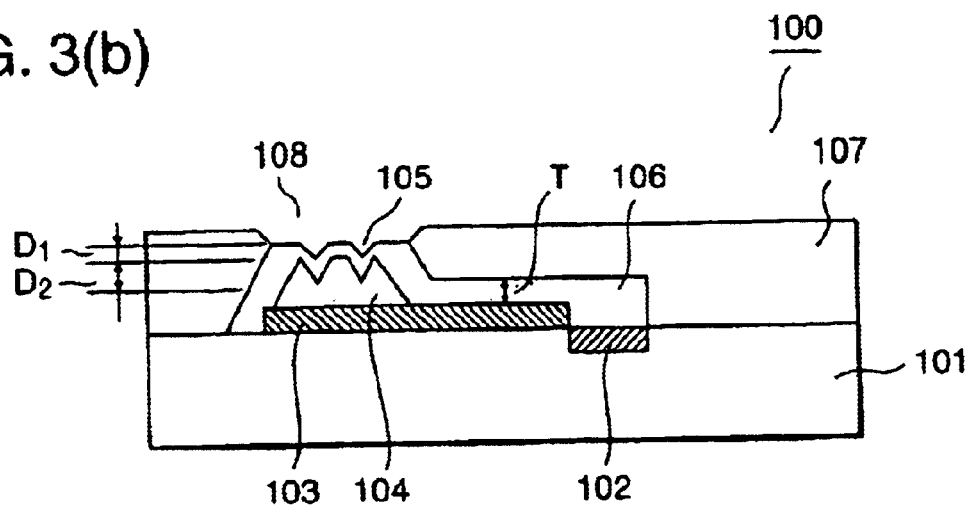

FIG. 3(a) is a plane view of one semiconductor package shown in FIG. 2(e), and FIG. 3(b) is a cross-sectional view of the semiconductor package shown in FIG. 3(a). FIG. 3(b) is an enlarged cross-sectional view of one insulated bump 104, taken on line 3–3' in FIG. 3(a). FIG. 4 is an enlarged plane view of the top of conductive patterns 106, exposed from the opening 108. FIG. 4 shows other shapes of groove 105 that can be applied to the invention.

As shown in FIG. 3(a), a plurality of openings 108 placed in a matrix form, which are disposed around the center 201 of the package, are provided on the top of the semiconductor package. These grooves 105 are formed on the conductive pattern 106 exposed from these openings 108, wherein these grooves 105 are disposed apart from each other and along the direction of expanding of the semiconductor package 100 by thermal stress. The expanding direction 203 extends from the center 201 of the semiconductor device 101 to the periphery 202 of the device 101.

Figure 4A:
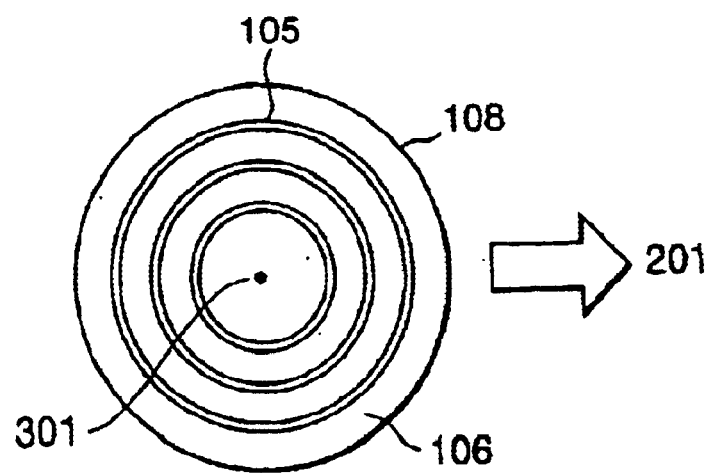
FIGS. 4(a) and 4(b) are plan views of another groove formed on a semiconductor device according to a first embodiment of the present invention.
Figure 4B:
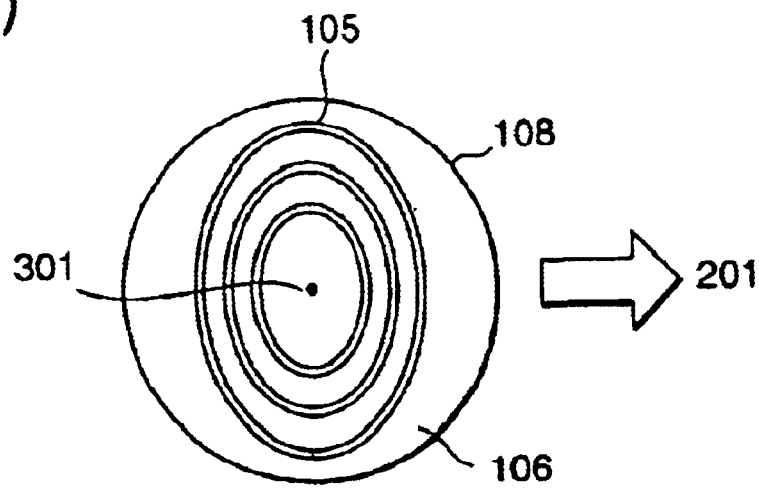

The grooves 105 formed on the top of the insulated bump 104 can be adopted ring shaped grooves (slits), for example concentric circles having one central point 301, shown in FIG. 4(a) and FIG. 4(b) as well as line shaped grooves (slits), shown in FIG. 3(a). The line shaped grooves and the ring shaped grooves are also disposed apart from each other and extending along the vertical direction to the expanding direction. That is, these grooves extend in a direction perpendicular to the direction in which the semiconductor chip is expanded by thermal stress.

In addition, as shown in FIG. 3(b), it is desirable that the depth D1 of the groove formed on the conductive pattern 106, which is provided on the top of the insulated bumps 104, is a half of thickness of the conductive layer to form the conductive pattern 106. If the thickness T of the Cu layer to form the conductive pattern 106 is about 20 μm, it is desirable that the depth D1 of the groove is about 10 μm. The depth D1 should be decided that the conductive pattern could avoid breaking, and the conductive pattern could be formed more easily. And it is also desirable that the depth D2 of the groove formed on the top of the insulated bump should be decided properly taking thought of the depth D1.

Figure 2F:
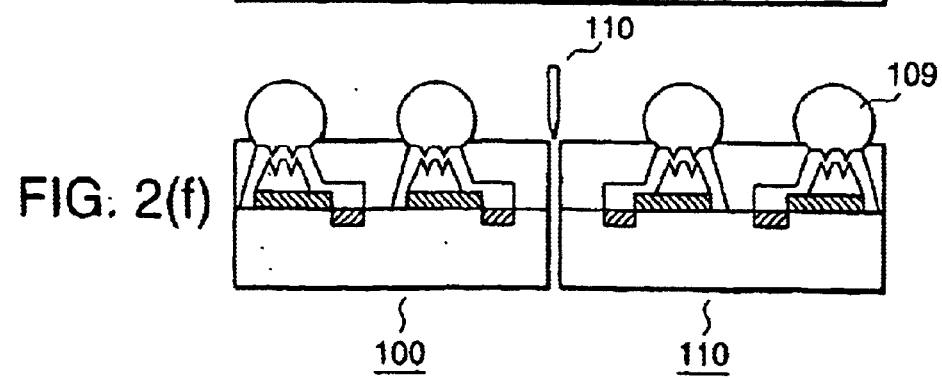

After that, as shown in FIG. 2(f), the external electrode 109 made preparations in advance is provided on the opening 108, that is the top of the conductive pattern 106 exposed from the opening 108. Then, the wafer 101 having the external electrode 109 is heated, and the external electrode 109 is connected to the top of the conductive pattern 106 having the grooves 105.

Finally a plurality of the separated semiconductor packages is provided by dicing the wafer 101 having the semiconductor devices with a dicing-saw.

As mentioned above, the semiconductor package according to the first embodiment can relieve the stress of the external electrodes 109 by disposing the grooves 105 on the top of the conductive pattern 106, wherein the grooves are placed apart from each other and along to the same direction of expanding of the semiconductor device by the thermal stress. These grooves 105 can break up the stress occurred to the interface between the external electrode 109 and the conductive pattern 106 for the expanding direction. The stress of the expanding direction is the largest stress of the semiconductor device.

Therefore, the damage of the external electrode can be avoided, the deterioration of the connecting quality will be prevented. These connecting quality problems are caused by the thermal stress generated heat under the process of mounting, the process of using the device and so on. According to the first embodiment of the present invention, reliance of the semiconductor device can be also improved because the semiconductor device has a lot of grooves 106 to absorb the stress on the conductive pattern and the external electrode.

Especially, through this embodiment, a plurality of grooves 105 formed on the interface between the conductive pattern 106 and the external electrode 109 can relieve the stress of the most sensitive parts, that is the part of connecting the external electrode 109 and the conductive pattern 106, formed from the thin metal layer. In other words, the semiconductor device of the present invention can avoid concentrating the stress at the external electrode 109 and the conductive pattern 106. As a result, it can prevent the damage of the external electrode and the breaking of the conductive pattern 106. According to this embodiment, the semiconductor device with high reliability can be provided.

The external electrode 109 in the first embodiment uses the ball electrode (solder ball) consisted of Sn—Pb solder, which is a main material of the ball electrode. However, in the first embodiment, it is not limited ball electrode consisted of Sn—Pb solder. The semiconductor device of the first embodiment can use the lead free solder, that solder doesn't including lead, for example Sn—Ag—Bi.

The ball electrode formed with the lead free solder is harder and more breakable than the ball electrode formed with the conventional solder, including lead. Therefore, it is desired that the present invention applies to the lead free solder ball, because the stress generated the interface of the external electrode can be concentrated to the grooves 105 to relieve the stress. Moreover, in this invention, the interface between the external electrode and the conductive pattern has roughness. Its roughness can ensure the strength to prevent the damage of the mounted external electrode, caused by the stress between the mother board and the semiconductor package.

In addition, as shown in the first embodiment of the semiconductor, during keeping until the semiconductor package mounted on the mother board, there is the possibility that moisture in the air enter the insulated bumps 104, made of the material with highly hygroscopic, e.g. polyimide. If the thermal process, for example mounting the semiconductor package on the mother board, is performed on these semiconductor packages including moisture, the moisture is vaporizing into the packages. As a result, there is the possibility of the damage of the conductive patterns, the peeling of the insulated bumps and so on.

Therefore, the semiconductor package having the insulated bumps, made of the material with highly hygroscopic, has a process to form a metal barrier before forming the insulated bumps. The metal barrier is formed on the predetermined region of the semiconductor wafer 101 in the spattering process. The metal barrier comprises a single layer or plural layers, and also made of titanium. (Ti), palladium (Pd), nickel (Ni), copper (Cu), gold (Au) and so on. After providing the metal barrier, the insulated polyimide bumps are formed in the mentioned process.

Through the process, the moisture-resistant layer covers all the surface of the insulated bumps. It can prevent the moisture entering the semiconductor package before mounted, especially the insulated bumps. As a result, these problems, the damage of the conductive patterns and the peeled off the insulated bumps, can be avoided during the thermal process, for example mounting the package on the board. By avoiding these problems, stable joints between the board and the package can be provided.

The following describes a semiconductor device according to a second embodiment of the present invention with reference to FIG. 5(*a*)–FIG. 5(*f*).

FIG. 5(*a*)–FIG. 5(*f*) are cross-sectional views showing processes in a second embodiment of the present invention. The same reference symbols as those used in the first embodiment correspond to the same or equivalent parts.

As mentioned above, the conductive pattern of the first embodiment formed with a thin metal layer, extending from the electrode pad 102 to the top of the insulated bump 104. In this second embodiment, as shown in FIG. 5(*f*), the conductive patterns 106 comprise a conductive layer 401 formed with a thin metal layer and a conductive post 402 made of conductive materials, for example copper. The conductive layer 401 is patterned, which is called a redistribution wiring. One end of each conductive layer 401 is electrically connected to the electrode pad 102, and the other end of the conductive layer 401 is connected to the conductive post 402. The conductive post 402 is connected to the conductive layer 401 and the external electrode 109.

The grooves 404 are provided on the interface between the external electrode 109 and the conductive layer 401 that is the top of the conductive post 402. The grooves 404 are disposed apart from each groove and along by the direction of expanding the semiconductor package 100 by thermal stress.

At first, also in the second embodiment, before the step shown in FIG. 4, a semiconductor wafer 101 will be performed the conventional wafer process, and semiconductor elements arranging like a matrix will be formed on the surface of the wafer-processed semiconductor wafer 101.

As shown in FIG. 5(*a*), electrode pads 102 are formed on the surface of the wafer 101 having semiconductor elements.

After forming the electrode pads 102, resin, for example polyimide, is applied on the surface of the wafer 102 by using a spin-coat process, and excess polyimide is removed by etching. Through these processes, a polyimide layer 103 is formed on the wafer surface except a region corresponding the electrode pads 102 and a region along borders of each semiconductor element.

Next, the metal layer to adhere the electrode pads 102 is formed on the surface of the wafer 101 as an undercoat of the conductive layer in spattering process. The metal layer is made of a titanium alloy or a chromium alloy. It is desired that the metal layer has these properties, a good adhesion between the metal layer and the electrode pads 102, a good adhesion between the metal layer and the insulated layer 103 formed on the wafer 101 and a less diffusion of metal.

After that, another metal layer to use electroplating is formed on the metal layer to adhere the electrode pads 102 in spattering process. The metal layer to use electroplating has a high electric resistance. For example, the metal layer to use electroplating is made of copper. After forming the metal layer to use electroplating, a Cu electroplating layer is formed on the metal layer to use electroplating in the electroplating process.

Following these processes, a conductive layer 401, which is comprising the metal layer to adhere the electrode pads, the metal layer to use electroplating and the Cu electroplating layer, is provided as shown in FIG. 5(*b*).

In FIG. 5(*c*), a conductive post (Cu post) 402 is formed on the end of the conductive layer 401, of which the other end connected to the electrode pad, by electroplating. The height of the Cu post 402 is about 70 μm. After the following process, the Cu post 402 is electrically connecting to a solder ball, which is the external electrode 109, and the conductive layer.

As shown in FIG. 5(*d*), resin to cover the Cu post 402 and the semiconductor elements formed on the wafer 101 is applied to the wafer 101.

The resin to cover the Cu post 402 and the semiconductor elements is applied in a spin-coating method, a printing method and so on.

After that, the resin formed on the Cu post 402 is removed, and sealing resin 107 having openings 108, which expose the top of the Cu post 402 having the grooves, is provided on the wafer.

As mentioned above, the conductive pattern 403 comprising the conductive layer 401 and the Cu post 402 is provided. And a part of the conductive pattern 403 exposed from the opening 108 of the sealing resin 107 is also provided.

Figure 5A:
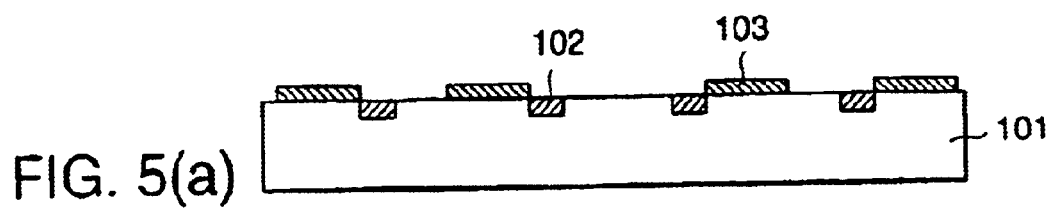
FIGS. 5(a)–(f) are cross-sectional views showing processes in a semiconductor device according to a second embodiment of the present invention.
Figure 5B:
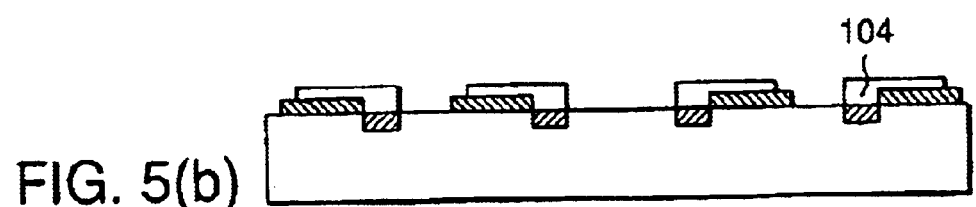
Figure 5C:
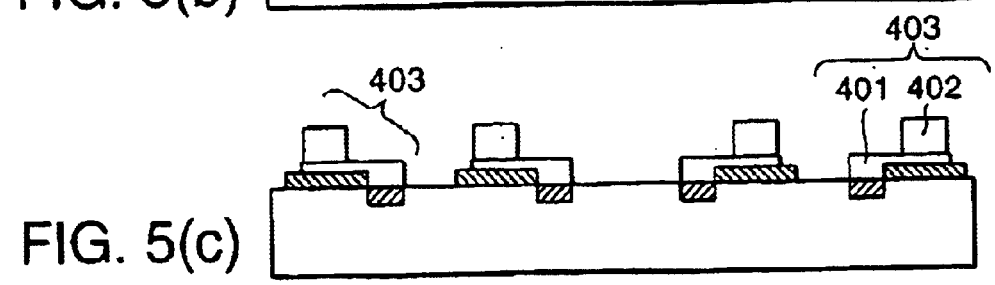
Figure 5D:
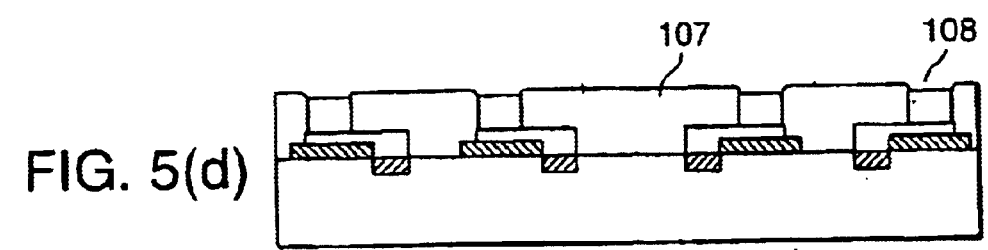
Figure 5E:
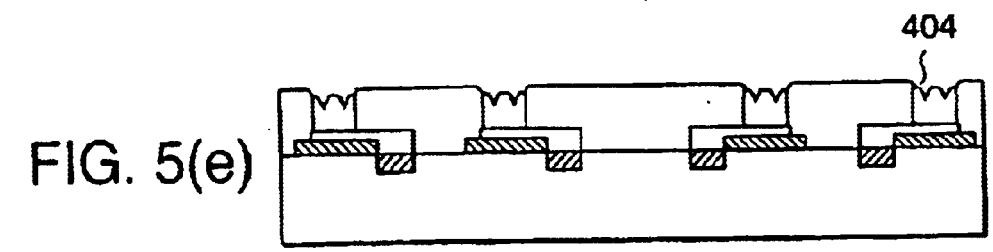

After these processes, as shown in FIG. 5(e), a plurality of grooves 404 are formed on the top of the exposed Cu post 402. These grooves 404 are also disposed apart from each groove and along the direction of expanding of the semiconductor package 100 by thermal stress. The expanding direction is from the center of the semiconductor device to the periphery of the device.

These grooves 404 formed on the top of the Cu post 402 are provided by the same conventional steps, for example etching with photolithography as the first embodiment. And the shapes of the grooves 404 are also same as the first embodiment.

Figure 5F:
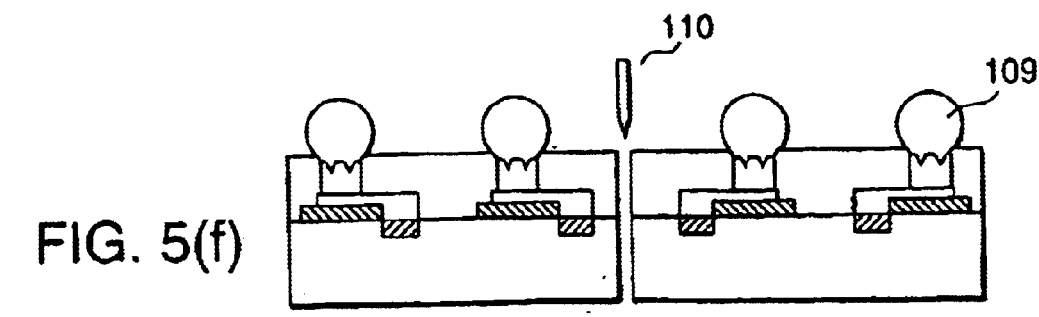

After that, as shown in FIG. 5(f), the external electrode 109 is provided on the opening 108, that is the top of the Cu post 402 exposed from the opening 108. The external electrodes are formed beforehand. Then, the wafer 101 having the external electrode 109 is heated, and the external electrode 109 is connected to the Cu post 402, comprising the conductive pattern.

Finally a plurality of the separated semiconductor packages is provided by dicing the wafer 101 formed the semiconductor devices with a dicing-saw.

As mentioned above, the semiconductor package according to the second embodiment can relieve the stress of the external electrodes 109 by disposing the grooves 404, wherein the grooves are placed apart from each other and along the same direction of expanding of the semiconductor device by the thermal stress. These grooves 404 can break up the stress occurred for the expanding direction. The stress of the expanding direction is the largest stress of the semiconductor device.

Therefore, the damage of the external electrode can be avoided, the deterioration of the connecting quality will be prevented. These connecting quality problems are caused by the thermal stress generated heat under the process of mounting, the process of using the device and so on. According to the first embodiment of the present invention, reliance of the semiconductor device can be also improved because the semiconductor device has a lot of grooves 105 to absorb the stress on the conductive pattern and the external electrode.

The semiconductor device according to the present invention can relieve the stress of the external electrodes by disposing the grooves, placed apart from each other and along the same direction of expanding of the semiconductor device by the thermal stress. These grooves can break up the stress occurred for the expanding direction. The stress of the expanding direction is the largest stress of the semiconductor device.

As a result, the problems, the damage of the external electrode can be avoided, the deterioration of the connecting quality will be prevented. These connecting quality problems are caused by the thermal stress generated heat under the process of mounting, the process of using the device and so on. According to the first embodiment of the present invention, reliance of the semiconductor device can be also improved because the semiconductor device has a lot of grooves 105 to absorb the stress on the conductive pattern and the external electrode.

What is claimed is:

1. A semiconductor device, comprising:
   a semiconductor chip having a surface, and expanding in a first direction when thermal stress is applied to said semiconductor chip;
   an electric circuit formed on the surface of said semiconductor chip;
   an electrode pad formed on the surface of said semiconductor chip and connected to said electric circuit;
   a conductive pattern electrically connected to said pad;
   a sealing resin covering said electric circuit and said conductive pattern so as to expose a part of said conductive pattern;
   a plurality of grooves formed on the part of said conductive pattern and spaced apart from each other along a direction parallel to the first direction; and
   an external electrode formed on the part of said conductive pattern.

2. The semiconductor device according to claim 1, wherein each of said grooves is a line-shaped groove extending in a direction perpendicular to the first direction.

3. The semiconductor device according to claim 1, wherein each of said grooves is a ring-shaped groove.

4. The semiconductor device according to claim 3, wherein said grooves are concentric circles.

5. The semiconductor device according to claim 1, wherein said external electrode is a solder ball.

6. The semiconductor device according to claim 5, wherein said solder ball is made of a lead-free material.

7. A semiconductor device, comprising:
   a semiconductor chip having a surface, and expanding in a first direction when thermal stress is applied to said semiconductor chip;
   an electric circuit formed on the surface of said semiconductor chip;
   an electrode pad formed on the surface of said semiconductor chip and electrically connected to said electric circuit;
   an insulated resin post provided on the surface of said semiconductor chip and disposed adjacent to said electrode pad;
   a conductive pattern extending on top of said insulated resin post from said electrode pad and electrically connected said electrode pad;
   a sealing resin covering said electric circuit and said conductive pattern so as to expose a part of said conductive pattern on the top of said insulated resin post;
   a plurality of grooves formed on the top of said insulated resin post and spaced apart from each other along a direction parallel to the first direction; and
   an external electrode electrically connected to said conductive pattern.

8. The semiconductor device according to claim 7, wherein each of said grooves is a line-shaped groove extending in a direction perpendicular to the first direction.

9. The semiconductor device according to claim 7, wherein each of said grooves is a ring-shaped groove.

10. The semiconductor device according to claim 9, wherein said grooves are concentric circles.

11. The semiconductor device according to claim 7, wherein said external electrode is a solder ball.

12. The semiconductor device according to claim 11, wherein said solder ball is made of a lead-free material.

13. The semiconductor device according to claim 7, wherein a depth of said grooves is substantially equal to a half of a thickness of said conductive pattern.

14. The semiconductor device according to claim 7, wherein said insulated resin post is made of heat-resistant resin.

15. The semiconductor device according to claim 14, further comprising:
a water-resistant layer formed between the surface of said semiconductor chip and a bottom of said insulated resin post.

16. The semiconductor device according to claim 7, wherein said insulated resin post is mesa-shaped.

17. A semiconductor device, comprising:
a semiconductor chip having a surface, and expanding in a first direction when thermal stress is applied to said semiconductor chip;
an electric circuit formed on the surface of said semiconductor chip;
an electrode pad formed on the surface of said semiconductor chip and electrically connected to said electric circuit;
an insulating layer covering said electric circuit and a part of said electrode pad;
a conductive pattern extending on said insulating layer from said electrode pad and electrically connected to said electrode pad;
a conductive post provided on a surface of said conductive pattern and electrically connected to said conductive pattern;
a sealing resin covering said electric circuit and said conductive pattern so as to expose a top of said conductive post;
a plurality of grooves formed on the top of said conductive post and spaced apart from each other along a direction parallel to the first direction; and
an external electrode formed on the top of said conductive post and electrically connected to said conductive post.

18. The semiconductor device according to claim 17, wherein each of said grooves is a groove extending in a direction perpendicular to the first direction.

19. The semiconductor device according to claim 17, wherein each of said grooves is a ring-shaped groove.

20. The semiconductor device according to claim 19, wherein said grooves are concentric circles.

21. The semiconductor device according to claim 17, wherein said external electrode is a solder ball.

22. The semiconductor device according to claim 21, wherein said solder ball is made of a lead-free material.

23. The semiconductor device according to claim 17, wherein said conductive pattern and said conductive post are made of copper.

24. The semiconductor device according to claim 1, wherein each of said grooves is an oval-shaped groove.

25. The semiconductor device according to claim 24, wherein said grooves are concentric ovals.

26. The semiconductor device according to claim 7, wherein each of said grooves is an oval-shaped groove.

27. The semiconductor device according to claim 26, wherein said grooves are concentric ovals.

28. The semiconductor device according to claim 17, wherein each of said grooves is an oval-shaped groove.

29. The semiconductor device according to claim 28, wherein said grooves are concentric ovals.

* * * * *